US006748572B2

(12) United States Patent
Fujine

(10) Patent No.: US 6,748,572 B2
(45) Date of Patent: Jun. 8, 2004

(54) POWER SUPPLY NETWORK ANALYZING METHOD, COMPUTER PROGRAM FOR EXECUTING THE METHOD, STORAGE MEDIUM AND POWER SUPPLY NETWORK ANALYZING APPARATUS

(75) Inventor: Eiji Fujine, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 123 days.

(21) Appl. No.: 10/062,496

(22) Filed: Feb. 5, 2002

(65) Prior Publication Data

US 2002/0199160 A1 Dec. 26, 2002

(30) Foreign Application Priority Data

Jun. 8, 2001 (JP) .................................. 2001-174643

(51) Int. Cl.$^7$ .............................................. G06F 17/50
(52) U.S. Cl. .............................. 716/5; 716/1; 703/18; 702/64; 702/65
(58) Field of Search .................. 716/1, 5; 703/18; 702/64, 65

(56) References Cited

U.S. PATENT DOCUMENTS 5,933,358 A * 8/1999 Koh et al. .................. 364/578
6,247,162 B1 * 6/2001 Fujine et al. ................ 716/2
6,405,354 B1 * 6/2002 Itazu et al. .................. 716/8

FOREIGN PATENT DOCUMENTS

| JP | 05-047928 | 2/1993 |
| JP | 2000-048057 | 2/2000 |
| JP | 2000-057186 | 2/2000 |

OTHER PUBLICATIONS

Tan et al., "Fast Power/Ground Network Optimization Based on Equivalent Circuit Modeling," IEEE, Jun. 22, 2001, pp. 550–554.*
Zhu et al., "Power Grid Modeling Technique for Hierarchical Power Network Analysis," IEEE, Mar. 28, 2001, pp. 313–318.*

* cited by examiner

*Primary Examiner*—Vuthe Siek
(74) *Attorney, Agent, or Firm*—Arent Fox PLLC

(57) ABSTRACT

Disclosed are a suitable power supply network analyzing method which executes power supply network analysis of a large-scale circuit in a short period of time with fewer computer hardware resources, a computer program which executes the power supply network analyzing method, a storage medium and a power supply network analyzing apparatus. An entire net list is extracted by converting circuit elements to current sources and dividing power supply lines into resistor elements, based on design information and physical information. Next, a portion of the power supply network which includes the current sources and in which the resistor elements are connected in series is selected. A partial net list is extracted to execute circuit compression by allocating the current sources to circuit elements in the selected portion. Then, the compressed net list is set in the entire net list to simplify the entire net list and power supply network analysis is performed. In case where analysis of the partial net list has not been completed, the results of the analysis of the entire net list is set to both end nodes and analysis is executed again. This can ensure hierarchical analysis.

19 Claims, 10 Drawing Sheets

FLOWCHART ILLUSTRATING POWER SUPPLY NETWORK ANALYSIS ACCORDING TO ONE EMBODIMENT

FLOWCHART ILLUSTRATING POWER SUPPLY NETWORK
ANALYSIS ACCORDING TO ONE EMBODIMENT

FIG.3 LAYOUT OF POWER SUPPLY NETWORK OF SEMICONDUCTOR INTEGRATED CIRCUIT DEVICE ACCORDING TO ONE EMBODIMENT

FIG.4 ENTIRE NET LIST EXTRACTED FROM POWER SUPPLY NETWORK

FIG.6 EXTRACTED PARTIAL NET LIST INCLUDING SELECTED CIRCUIT COMPRESSION TARGET TO WHICH CURRENT SOURCES ARE ALLOCATED

FIRST SPECIFIC EXAMPLE OF COMPRESSED NET LIST

SECOND SPECIFIC EXAMPLE OF COMPRESSED NET LIST

FIG.9 ENTIRE NET LIST REPLACED WITH COMPRESSED NET LIST OF FIRST SPECIFIC EXAMPLE

FIG.10 RESULT OF POWER SUPPLY NETWORK ANALYSIS ON ENTIRE NET LIST IN FIG.9

RESULT OF POWER SUPPLY NETWORK ANALISIS ON PARTIAL NET LIST

POWER SUPPLY NETWORK ANALYZING METHOD, COMPUTER PROGRAM FOR EXECUTING THE METHOD, STORAGE MEDIUM AND POWER SUPPLY NETWORK ANALYZING APPARATUS

BACKGROUND OF THE INVENTION

1. Field of the Invention

The present invention relates to a power supply network analysis of a circuit device, and, more particularly, to an analysis of a power supply network of a large-scale semiconductor integrated circuit device.

2. Description of Related Art

Recently, higher performance and complexity of functions are demanded as the scale of circuits mountable in a semiconductor integrated circuit device increases in accordance with the miniaturization of the fabrication process. As a result, the scale of circuits mountable in a semiconductor integrated circuit device becomes larger and larger and the operational frequency becomes higher. To meet those demands, it becomes necessary to supply larger power source currents with the limited circuit layout area and operational timings. It is therefore important to inspect whether or not power supply lines can secure the supply of power necessary and sufficient for the individual circuit operations.

Performing this inspection is a power supply network analysis. A power supply network is an equivalent circuit which has resistors provided on power supply lines as resistor elements, has circuit elements, which consume currents, converted to current sources and has the current sources connected to connection nodes on the power supply lines to which the circuit elements are connected. Voltage values at the individual connection nodes on the power supply lines to which the circuit elements are connected and values of currents flowing across resistor elements that connect the nodes are acquired by solving the equivalent circuit. By examining the acquired voltage values and current values, it is possible to inspect whether or not the values of voltages to be supplied to the circuit elements connected to the individual nodes are fully sufficient, the currents flowing in the individual power supply lines are sufficient for the electromigration resistance and the reliability over a long operation can be guaranteed.

The following will discuss several methods that have conventionally been performed as power supply network analyses.

The first method is to replace basic elements, such as transistors, as circuit elements with current sources and extract a net list of a power supply network. This method was employed in the early stage of power supply network analysis. This method can accurately analyze a power supply network in case where the circuit scale is small.

The second method is to convert a collection of basic circuit units, such as logic gates, as a circuit cell, into a single current source. As this method can perform a power supply network analysis on the internal interconnection lines of a circuit cell without using a net list, the method is effective when adapted to a power supply network analysis on a larger circuit scale than is involved in the first method.

The third method is to omit a part of the net list of a circuit block constructed by using a plurality of circuit cells as defined in the second method and arrange the net list into a simple net list. One example of simplifying a net list using the third method is disclosed in, for example, Japanese Unexamined Patent Publication No. 2000-57186. The disclosed method comprises the step of extracting data on the widths of individual power supply terminals from layout data of a circuit block and the step of setting ratios of the individual widths to ratios of the amounts of currents consumed at the individual power supply terminals based on the data on the widths of the individual power supply terminals, and estimates the values of source currents to the individual power supply terminals from the ratios and the sum of the values of source currents to the circuit block. In other words, the third method estimates the ratios of the amounts of currents consumed at the individual power supply terminals based on layout information correlated with the amounts of source currents consumed, such as the areas of individual internal interconnection lines, the number of contacts that connect the individual internal interconnection lines to individual transistors, the areas of the contacts and the sum of the gate widths of the transistors to be connected to the individual internal interconnection lines, in addition to the widths of the individual power supply terminals. As a circuit block can be modeled by allocating current sources to the individual power supply terminals with the internal interconnection lines omitted, this method can simplify the net list.

The fourth method is to compress a net list in a circuit block leaving power supply terminals of the circuit block by using the Kirchhoff's law. One example of compressing a net list using the fourth method is disclosed in, for example, Japanese Unexamined Patent Publication No. Hei 5-47928. The publication discloses a voltage computing method for power supply lines, which computes voltages of bending points of power supply lines and connection points from layout data of an integrated circuit that has a hierarchical design and has child cells included in a parent cell. The method prepares resistor/current source networks from the layout data of the parent cell excluding the child cells and the child cells, converts the resistor/current source network of the child cells into an equivalent circuit network equivalent to the resistor/current source network and having fewer nodes, incorporates the equivalent circuit network of the child cells into the resistor/current source network of the parent cell excluding the child cells, acquires voltage values at individual nodes in the parent cell excluding the child cells by solving a simultaneous linear equation of the resistor/current source network having voltage sources set to nodes to be connected to external units, and acquires voltage values at individual nodes in the child cells by solving a simultaneous linear equation of the resistor/current source network having voltage sources set to nodes to be connected to outside the resistor/current source network of the child cells. As solutions are obtained separately for the child cells and the parent cell excluding the child cells, the order of the simultaneous linear equation becomes smaller, thus shortening the time needed to solve the simultaneous linear equation.

According to the first method, however, as a net list is prepared by converting basic elements, such as transistors, as circuit elements to current sources and replacing portions between nodes of the power supply lines to which the current sources are connected with resistor elements included in the power supply lines, the scale of the net list becomes larger in proportion to the number of basic elements, such as transistors. The practical processing limit for the basic elements is about several tens of thousands of transistors. In case where this method is adapted to a recent large-scale integrated circuit, the analysis takes a vast amount of time using the hardware resources of an ordinary computer and may not be possible due to insufficient hardware resources, such as memory, depending on the contents of the analysis. The method therefore has such a problem that analysis cannot be executed effectively within a practical time.

While the second method can perform analysis in a larger circuit scale than the first method, it has restrictions on practical computer hardware resources in terms of the time and resources with respect to LSIs having a scale of one million logic gates, such as the recent LSIs. In consideration of the future improvement on the circuit integration, the second method will have a difficulty in analyzing a power supply network.

According to the third method, layout information, such as the widths of individual power supply terminals in a circuit block which is simplified by omitting a part of a net list has a certain correlation with the values of source currents consumed in the individual power supply terminals. However, the values of consumed source currents are settled by the circuit design, have a correlation with layout information, such as the width of the power supply terminals and the device sizes of transistors or the like, and depends on the operational ratios of the individual elements. The width of the power supply terminals and the device sizes or the like are designed with adequate margins within the range where the circuit operation can be guaranteed and the power supply terminals and circuit elements are laid out within a limited range due to the demanded high integration. That is, the widths of individual power supply terminals and the device sizes and the values of consumed source currents do not have a precise correlation with each other. As a net list is simplified by allocating current sources to individual power supply terminals by omitting interconnection lines in a circuit block to be simplified, a part of a power supply network is omitted. It is not therefore possible to accurately set the ratios of the amounts of consumed currents that are allocated to the individual power supply terminals in a circuit block to be simplified in a power supply network analysis. Further, the omission of the interconnection lines in the circuit block to be simplified actually omits a part of the power supply network, so that the analysis precision cannot be improved.

In case where the scale of the circuit to be analyzed becomes larger and the circuit scale of a child cell becomes larger, the fourth method disadvantageously takes time in the compression process for the child cells. Further, in case where the circuit scale of a child cell is large and the number of power supply terminals to be connected to a parent cell is large, the net list of the child cell, even if compressed, cannot be simplified sufficiently.

SUMMARY OF THE INVENTION

Accordingly, it is an object of the present invention to provide a power supply network analyzing method which can execute power supply network analysis of a large-scale circuit in a short period of time with fewer computer hardware resources by performing a hierarchical analysis process of compressing a part of a net list to reduce the scale of an entire net list by using the simplified net list and then analyzing a partial net list before compression based on the results of the previous analysis, and a computer program, a storage medium and a power supply network analyzing apparatus, which execute the power supply network analyzing method.

To achieve the object, according to one aspect of the present invention, there is provided a power supply network analyzing method for analyzing a characteristic of a power supply network having circuit elements to be supplied with power over power supply lines as current sources and constructed by dividing the power supply lines into resistor elements by using a net list of the power supply network, comprising a first step of converting the circuit elements to the current sources based on design information and computing the resistor elements included in the power supply lines based on physical information, thereby extracting an entire net list; a second step of selecting a portion of the power supply network which includes the current sources and in which the resistor elements are connected in series, and extracting a partial net list; a third step of acquiring a compressed net list by performing circuit compression on the partial net list; a fourth step of replacing the partial net list with the compressed net list and acquiring voltage values of individual nodes in the entire net list and current values between the individual nodes in the entire net list by applying a supply voltage to a power supply terminal in the entire net list; and a fifth step of acquiring voltage values of individual nodes in the partial net list and current values between the individual nodes in the partial net list by giving both end nodes of the partial net list to voltage values of the individual nodes in the entire net list acquired by the fourth step.

According to the power supply network analyzing method, the first step extracts an entire net list by converting the circuit elements to the current sources based on design information and computing the resistor elements included in the power supply lines based on physical information. The second step selects a portion of the power supply network which includes the current sources and in which the resistor elements are connected in series, and extracts a partial net list. The third step acquires a compressed net list by performing circuit compression on the partial net list. The fourth step replaces the partial net list with the compressed net list and acquires voltage values of individual nodes in the entire net list and current values between the individual nodes in the entire net list by applying a supply voltage to the power supply terminal in the entire net list. The fifth step acquires voltage values of individual nodes in the partial net list and current values between the individual nodes in the partial net list by giving both end nodes of the partial net list to voltage values of the individual nodes in the entire net list acquired by the fourth step.

A computer program according to another aspect of the present invention comprises a first step of replacing the circuit elements with the current sources having consumed source current values to be consumed in the circuit elements and replacing resistor components of the power supply lines with resistor elements which connect between predetermined nodes, based on input design information and physical information, thereby extracting an entire net list; a second step of selecting a portion of the power supply network which includes the current sources and in which the resistor elements are connected in series, and extracting a partial net list from the entire net list extracted in the first step; a third step of extracting a compressed net list which is the partial net list simplified; a fourth step of replacing the partial net list with the compressed net list and acquiring voltage values of the predetermined nodes and values of currents flowing in the resistor elements by analyzing the entire net list; and a fifth step of acquiring the voltage values of the predetermined nodes in the partial net list and the values of currents flowing in the resistor elements in the partial net list by giving both end nodes of the partial net list with voltage values of the predetermined nodes acquired by the fourth step.

Described in the computer program are a series of power supply network analysis procedures which allow the first step to extract an entire net list, allow the second step to extract a partial net list by selecting a portion of the power supply network which includes the current sources and in which the resistor elements are connected in series, allow the third step to extract a compressed net list which is the partial net list simplified, allow the fourth step to replace the partial net list with the compressed net list and acquire voltage values and current values, which are associated with individual predetermined nodes in the entire net list, and allow the fifth step to acquire the voltage values and current values, which are associated with individual predetermined nodes in the partial net list.

According to a further aspect of the present invention, there is provided a storage medium in which a computer readable program is stored to execute power supply network analysis for analyzing a characteristic of a power supply network having circuit elements to be supplied with power over power supply lines as current sources and constructed by dividing the power supply lines into resistor elements by using a net list of the power supply network. The program comprises a first step of converting the circuit elements to the current sources based on design information and computing the resistor elements included in the power supply lines based on physical information, thereby extracting an entire net list; a second step of extracting a partial net list of a portion of the power supply network which includes the current sources and in which the resistor elements are connected in series; a third step of acquiring a compressed net list by performing circuit compression on the partial net list; a fourth step of replacing the partial net list with the compressed net list and acquiring voltage values of individual nodes in the entire net list and current values between the individual nodes in the entire net list by applying a supply voltage to a power supply terminal in the entire net list; and a fifth step of acquiring the voltage values of the individual nodes in the partial net list and the current values between the individual nodes in the partial net list by giving both end nodes of the partial net list to voltage values of the individual nodes in the entire net list acquired by the fourth step.

Stored in the storage medium is a computer readable program for executing a series of power supply network analysis procedures which allow the first step to extract an entire net list, allow the second step to extract a partial net list, allow the third step to extract a compressed net list by performing circuit compression on the partial net list, allow the fourth step to replace the partial net list with the compressed net list and acquire voltage values at individual nodes in the entire net list and current values between the individual nodes in the entire net list, and allow the fifth step to acquire the voltage values at individual nodes in the partial net list and current values between the individual nodes in the partial net list.

With the above design, it is possible to perform a power supply network analysis on a simplified entire net list in which a partial net list is replaced with a compressed net list that has undergone circuit compression and then perform a power supply network analysis on the partial net list before compression based on the results of the previous analysis. Power supply network analysis can be carried out hierarchically by designing a hierarchical power supply network by replacing a part of an entire net list with a compressed net list that has undergone circuit compression. This can ensure a power supply network analysis of a large-scale circuit in a short period of time with fewer computer hardware resources.

Because the Kirchhoff's law can be used in circuit compression of a partial net list, net list information will not be omitted and lost in the compressed net list. The precision of the power supply network analysis of the entire net list in which a partial net list is replaced with a compressed net list will not become lower. As the power supply network analysis of a partial net list is executed based on the results of that analysis, the precision of analysis of the partial net list will not become lower. It is possible to execute a power supply network analysis of a large-scale circuit in a short period of time with fewer computer hardware resources without lowering the analysis precision.

Because a limited portion which includes current sources and in which resistor elements are connected in series is selected as a partial net list to be compressed, circuit compression can be executed easily and the compressing process does not take time. Further, the partial net list to be selected has the number of power supply terminals to be limited to two, so that the compressed net list can be made sufficiently simple. As an entire net list replaced with a compressed net list can be simplified, it is possible to execute a power supply network analysis of a large-scale circuit in a short period of time with fewer computer hardware resources.

Here, a computer program can be provided in the form of a storage medium where the program is stored as well as can be supplied via a transmission medium, such as the Internet.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Preferred embodiments of a power supply network analyzing method according to the present invention, and a computer program, a storage medium and a power supply network analyzing apparatus, which execute the power supply network analyzing method, will be described in detail below with reference to FIGS. 1 through 11.

Figure 1:
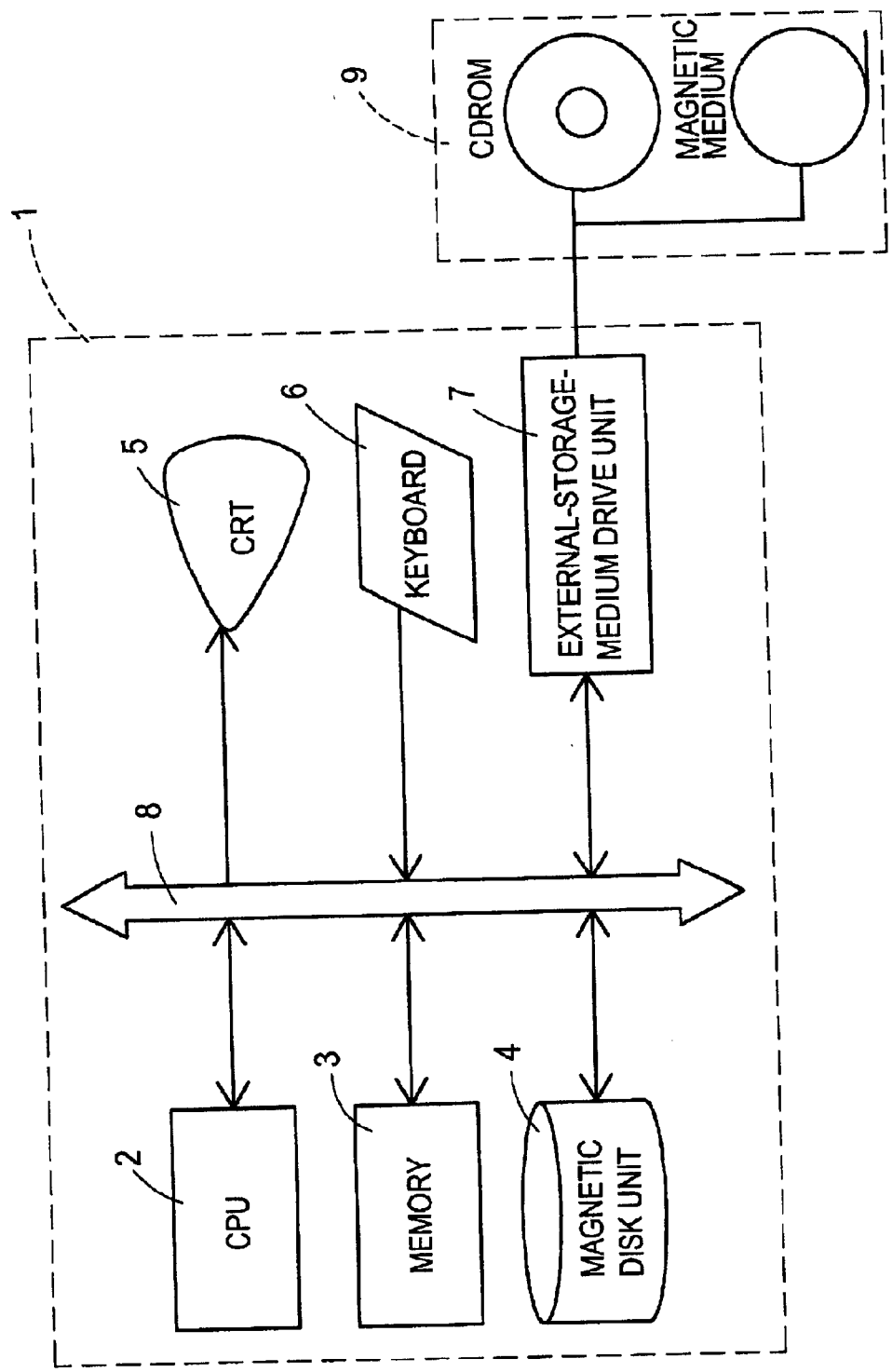
FIG. 1 is a structural diagram illustrating a power supply network analyzing apparatus according to one embodiment of the invention.

A power supply network analyzing apparatus 1 in FIG. 1 comprises a central processing unit (hereinafter abbreviated as "CPU") 2, a memory 3, a magnetic disk unit 4, a display device (hereinafter referred to as "CRT") 5, a keyboard 6 and an external-storage-medium drive unit 7, all mutually connected via a bus 8 with the CPU 2 in the center. The power supply network analyzing apparatus 1 further has an external storage medium 9, such as a CD-ROM or a magnetic medium, connected to the external-storage-medium drive unit 7.

A program which executes the flow of a power supply network analysis illustrated in FIG. 2 to be discussed later is stored in the memory 3 or the magnetic disk unit 4 in the power supply network analyzing apparatus 1, or is stored in the memory 3 or the magnetic disk unit 4 via the external-storage-medium drive unit 7 or is directly transferred to the CPU 2 in case where the program is stored in the external storage medium 9, such as a CD-ROM or a magnetic medium. Design information storage means D1 which stores design information typified by circuit information, such as circuit element parameters, such as the supply voltage and the relation of connection among circuit elements besides the transistor size, the current capacity, and physical information storage means D2 which stores physical information, such as layout information including layout information on circuit elements and layout information on the arrangement or the like of power supply lines and process device information including line type information, such as the layout widths of the power supply lines and the sheet resistance, are stored in the magnetic disk unit 4 or the external storage medium 9, such as a CD-ROM or a magnetic medium. The design information storage means D1 and physical information storage means D2 are referred to, as needed, in response to an instruction from the CPU 2 in accordance with the process of the program. In accordance with the program that executes the power supply network analysis illustrated in FIG. 2, the results of the power supply network analysis that has been executed while referring to the design information storage means D1 and the physical information storage means D2 are checked by the confirmation means, such as the CRT 5. In case where the analysis results require correction, alteration or the like of the layout widths of the power supply lines and the arrangement routes thereof is carried out in accordance with an instruction input from the keyboard 6 or the like. In case where no correction is needed, it is determined that the analyzed power supply lines can be used satisfactorily and power supply line data is stored in the magnetic disk unit 4 or in the external storage medium 9, such as a CD-ROM or a magnetic medium, via the external-storage-medium drive unit 7.

The flow of the power supply network analysis will now be described specifically by referring to FIG. 2. FIG. 2 illustrates the flowchart of the power supply network analysis. In a processing step (hereinafter abbreviated as "S") 1, circuit elements, such as transistors, logic gates and functional blocks, are converted to current sources based on design information stored in the design information storage means D1. Further, an entire net list is extracted by treating points at which the power supply lines are connected to one another, bending points and points to which the circuit elements are connected as nodes based on physical information, such as layout information of the circuit elements, arrangement information of the power supply lines and positional information of power supply terminals, stored in the physical information storage means D2, and calculating the resistances of resistor elements between the nodes based on physical information, such as the layout widths of the power supply lines and the sheet resistance.

Here, the current values of the circuit elements at the time of converting the circuit elements to current sources are average consumed current values and there are several ways available to compute the values. When the operational ratios of the individual circuit elements are known, for example, there is a case where the current values are obtained specifically as average values. This is a case where a drive load is settled for a circuit element, such as a drive circuit for a clock signal whose oscillation frequency and operational duty are settled. Because the value of the current consumed by this circuit element is acquired by simple calculation, the current value of the converted current source should be determined on the premise that the same current value as the acquired one is supplied from the power supply lines.

There is a case where even if the operational ratio of each circuit element is known, the current value is not acquired specifically and is settled as a specific ratio of the average consumed current values of the circuit elements. This is a case where the frequency of accesses to the bus is changed by an external factor when there are line drivers for driving two known kinds of buses which have different drive loads. Because the loads of the buses are known, the ratio of the consumed currents of both line drivers to each other is settled specifically but the actual current values will not be settled unless the access frequency is settled. In this case, when the external factor is settled in the power supply network analysis, the entire net list or the like is settled and the current values are determined specifically.

In case where the operational ratios of the circuit elements are unknown, the average consumed current values should be settled through circuit simulation or the like. This is an effective calculation method when adapted to a circuit element, such as a random logic circuit, whose operational ratio is not settled specifically.

Next, selection of a target to undergo circuit compression (S2) is executed. A portion which includes current sources and in which resistor elements are connected in series, or the target to undergo circuit compression, is selected from the entire net list. At the time of making the selection, the portion of interest (target portion) can easily be searched based on layout information of the circuit elements, arrangement information of the power supply lines and the layout widths and the sheet resistance or the like of the power supply lines. For example, the target portion can be selected, without searching the entire net list at random, by using layout information about circuit elements laid out by a floor plan tool and type information of the power supply lines, such as the layout widths and the sheet resistance or the like of the power supply lines that is given the power supply lines by an automatic power supply line tool. This selection need not be executed for each of layout blocks provided for the respective circuit functions, but the target portion on the layout can be selected as needed based on physical information stored in the physical information storage means D2. The selected portion may be a part in a layout block or may extend over a plurality of layout blocks. Further, in case where there are plural target portions, an arbitrary one can be selected therefrom as needed.

The extraction of the entire net list (S1) and the selection of a target to be subjected to circuit compression (S2) should not necessarily be in this order, but the selection of a target to be subjected to circuit compression (S2) can be performed prior to the entire net list extraction (S1).

A partial net list is extracted (S3) by allocating current sources to circuit elements included in the portion which has been selected as a target to be subjected to circuit compression based on the design information stored in the design information storage means D1 and dividing the power supply lines into resistor elements to which resistances are allocated based on the physical information stored in the physical information storage means D2. The method of the extraction is the same as the method of extracting the entire net list in S1.

The partial net list extracted in S3 is subjected to circuit compression in S4. By using the Kirchhoff's law, a compressed net list compressed to a simple circuit model is acquired. The acquired compressed net list is replaced with the partial net list in the entire net list to simplify the entire net list to the degree at which a power supply network analysis can be executed (S5).

A power supply network analysis is performed on the entire net list simplified in S5 (S6). The voltage values of the individual nodes in the entire net list and current values between the individual nodes in the entire net list are acquired as the results of the analysis. At this stage, the partial net list is replaced with the compressed net list simplified by circuit compression, so that nothing other than a voltage value across both end nodes is obtained for the partial net list.

It is checked if the power supply network analysis has been completed for the partial net list (S7). If there is an unanalyzed partial net list (NO in S7), the voltage value across both end nodes of the compressed net list that has been acquired in the analysis of the entire net list is set for both end nodes of the target partial net list (S8) and a power supply network analysis is carried out again (S6). After this process is executed for all partial net lists undergone circuit compression (YES in S7), all node voltage values and between-nodes current values of the entire net list are acquired and the analysis is completed.

Figure 2:
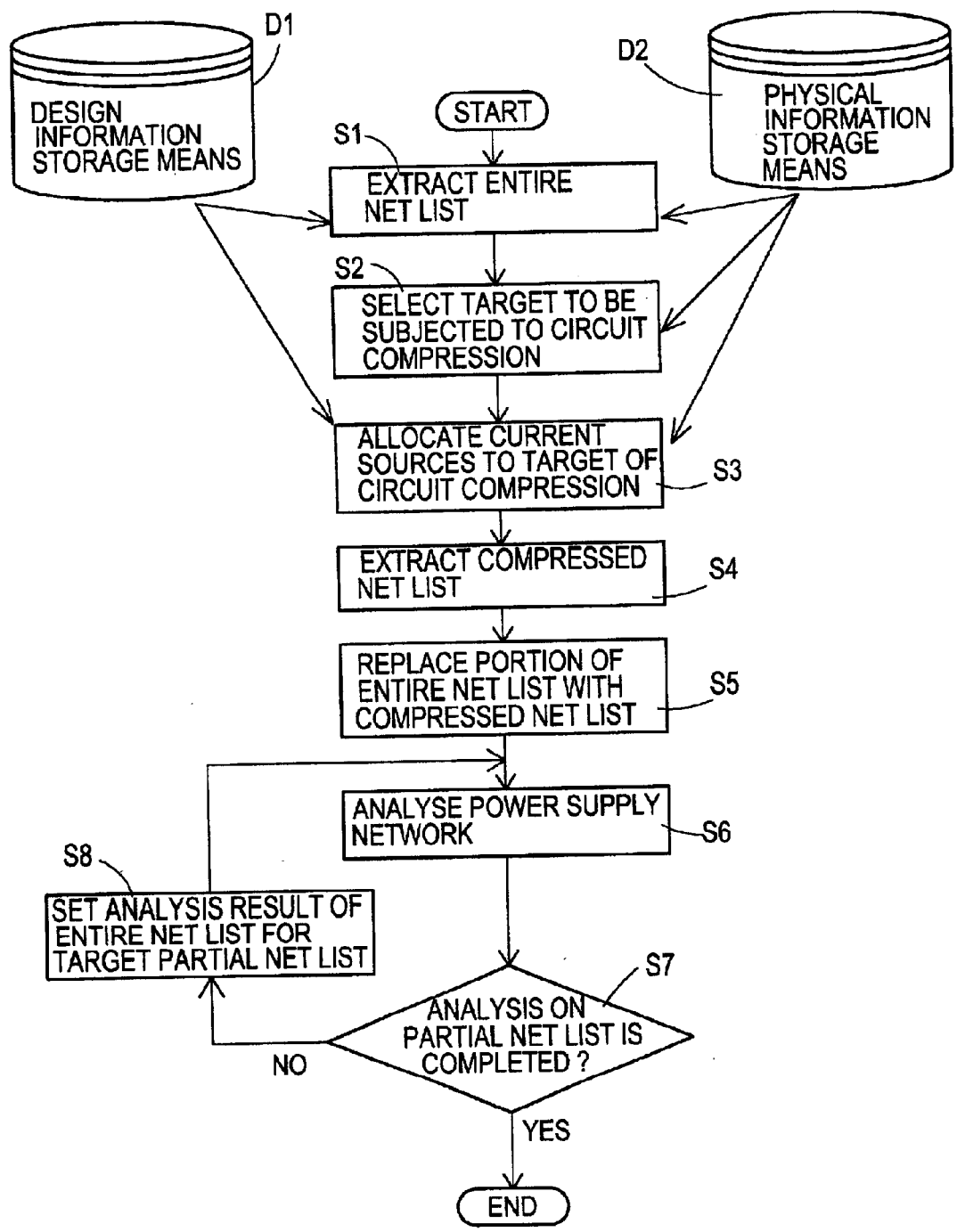
FIG. 2 is a flowchart illustrating a power supply network analysis according to the embodiment.
Figure 3:
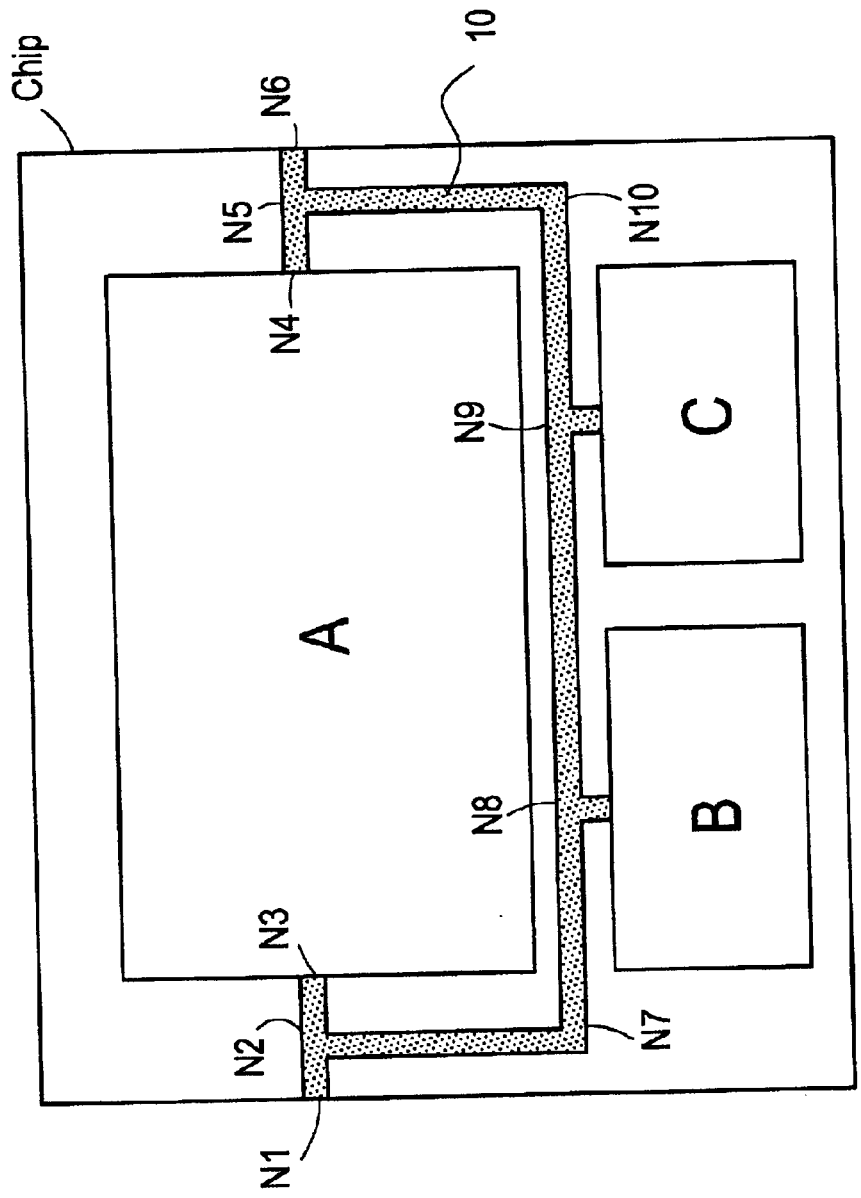
FIG. 3 is a layout of power supply network of a semiconductor integrated circuit device according to the embodiment.

A description will now be given of a case where the analysis flow in FIG. 2 is adapted to a semiconductor integrated circuit device in FIG. 3 (Chip in FIG. 3). FIG. 3 is a layout pattern diagram exemplarily showing circuit blocks A, B and C, a power supply line 10 which connects the circuit blocks A, B and C to one another, and external connection terminals N1 and N6 which externally apply supply voltages to the power supply line 10 in the semiconductor integrated circuit device in FIG. 3 (Chip in FIG. 3).

The circuit block A is connected with the power supply line by a line path from the external connection terminal N1 to a node N3 and a line path from the external connection terminal N6 to a node N4. The power supply line is branched from branch nodes N2 and N5 that are located in the line paths. The branched power supply lines are bent at nodes N7 and N10 in such directions as to face each other. The power supply line is connected to the circuit block B from a node N8 and to the circuit block C from a node N9 both in the power supply line path.

Figure 4:
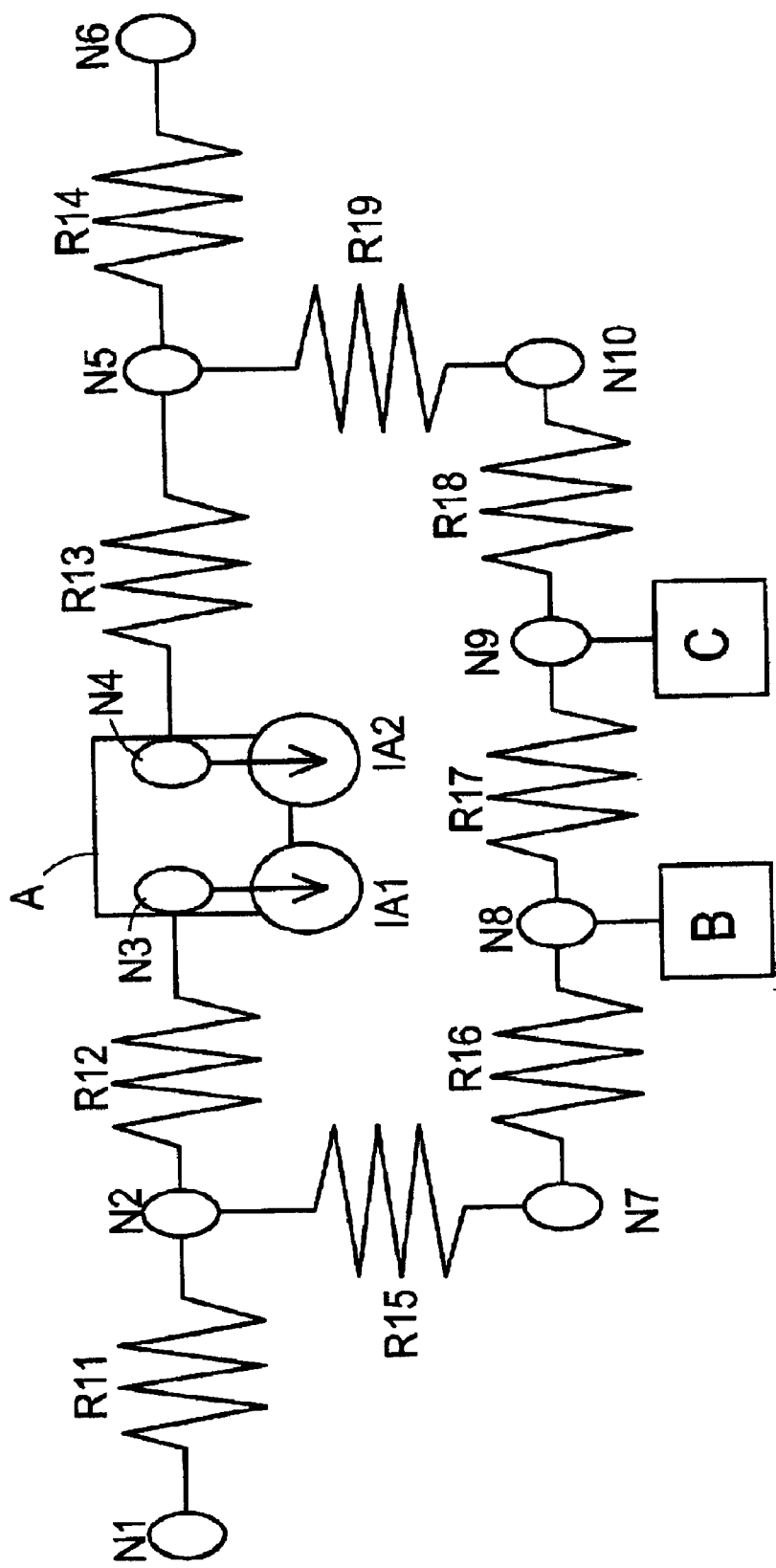
FIG. 4 is a circuit diagram showing an entire net list extracted from a power supply network.

FIG. 4 shows an entire net list which is extracted in S1 based on design information and physical information, associated with the semiconductor integrated circuit device, respectively stored in the design information storage means D1 and the physical information storage means D2. The nodes N1 to N10 respectively set for the external power supply connection terminals, the branch points of the power supply line, the bending points thereof and connection points to the circuit elements and resistor elements R1 to R19 that make connection among the nodes N1 to N10 are extracted. Note that for the circuit block A, the extraction is carried out on the premise that the source currents consumed at the power supply terminals N3 and N4 are known current values IA1 and IA2. The case where the current values are known may be a case where the circuit block A is set in a library as a macro circuit block or a case where as in a clock generator, the circuit operation can be defined by the operational ratio or the like and the source current value consumed at each power supply terminal is determined specifically.

Figure 5:
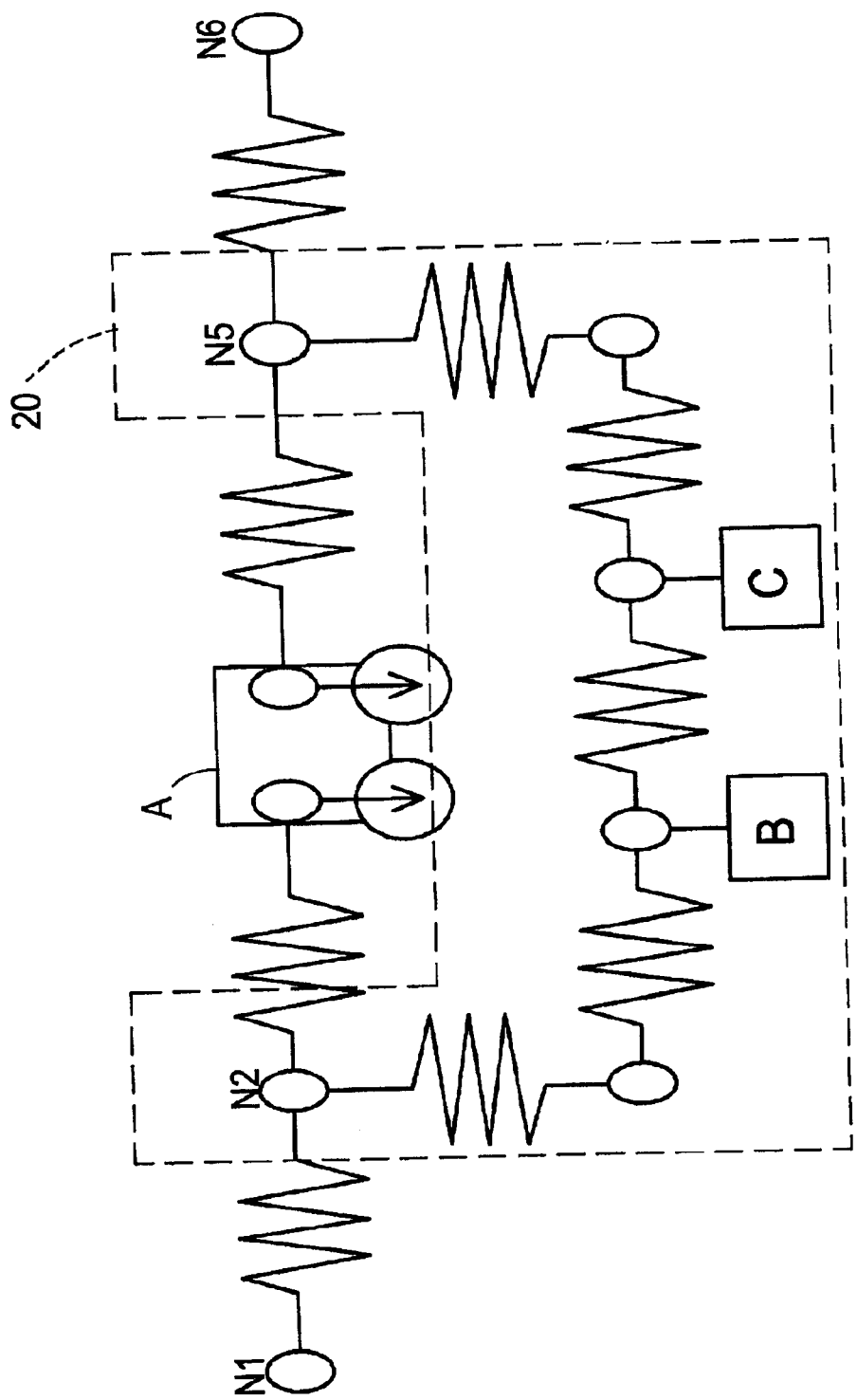
FIG. 5 is a circuit diagram showing a circuit compression target selected from the entire net list.

FIG. 5 shows the selection of a circuit compression target in S2. The path of the power supply line that extends toward the circuit blocks B and C from the node N2 and reaches the node N5 is selected as a compression target 20 that includes circuit elements which are expressed by current sources and in which resistor elements are connected in series. Because the entire net list of the power supply network is relatively simple in the present invention (FIG. 4), the compression target 20 can be selected based on the entire net list. In case where a considerable time is needed to search a selected portion from the entire net list as in a case where the entire net list becomes more complex, however, it is preferable to select the target portion from the layout diagram in FIG. 3 or the physical information storage means D2 or the like.

Figure 6:
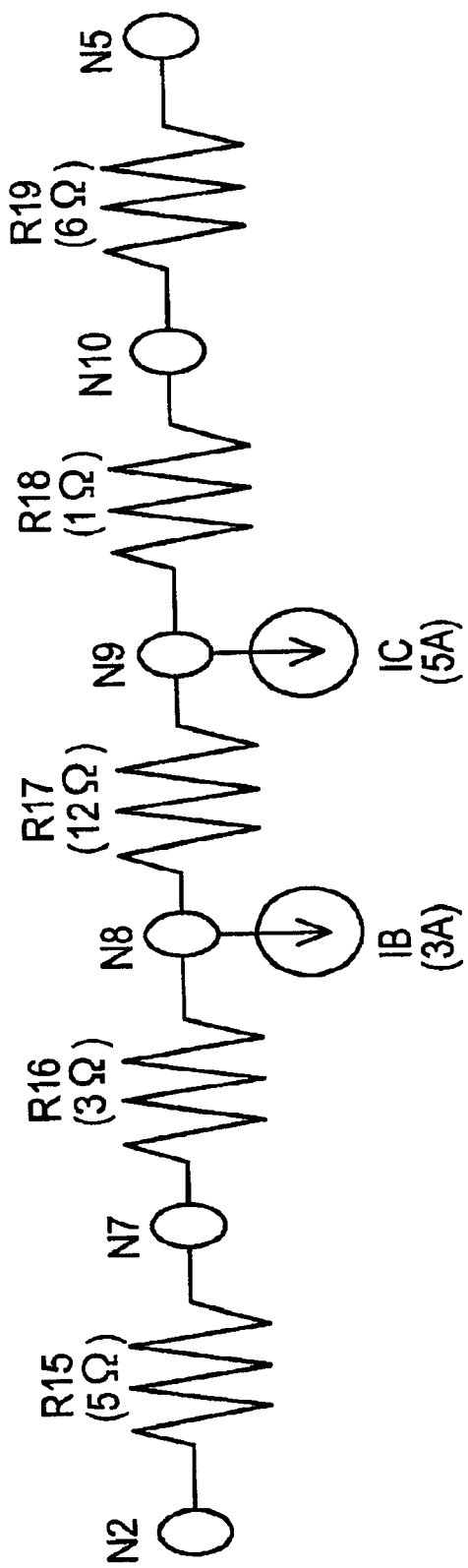
FIG. 6 is a circuit diagram showing an extracted partial net list including the selected circuit compression target to which current sources are allocated.

A partial net list in FIG. 6 is extracted in S3. The partial net list is extracted by replacing the circuit blocks B and C connected to the compression target 20 with current sources having current values IB and IC and dividing the path of the power supply line into resistor elements R15 to R19. In the present invention, specific values as shown in FIG. 6 are substituted in individual current values and resistances in the following description.

Figure 7:
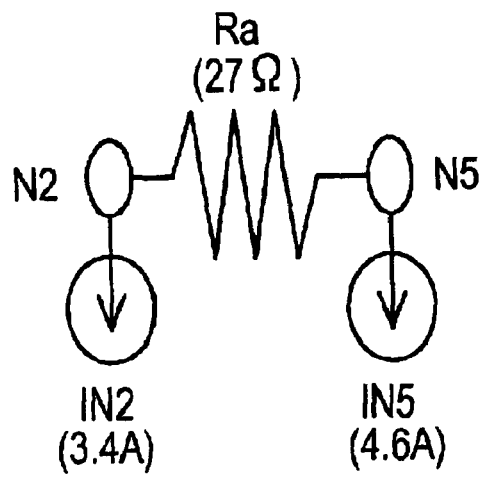
FIG. 7 is a circuit diagram illustrating a first specific example of a compressed net list obtained by performing circuit compression on a partial net list.
Figure 8:
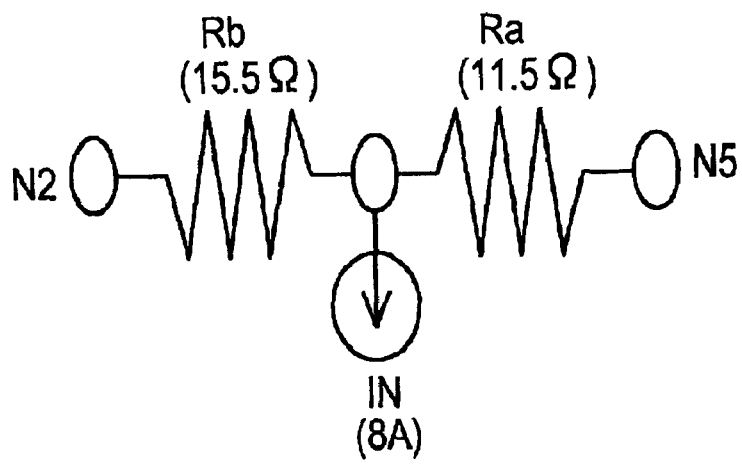
FIG. 8 is a circuit diagram illustrating a second specific example of a compressed net list obtained by performing circuit compression on a partial net list.

FIGS. 7 and 8 show compressed net lists obtained as results of the process in S4. FIG. 7 illustrates a first specific example. The first specific example is a method of compressing the compression target 20 to a first resistor element Ra, and first and second current sources IN2 and IN5 connected to both end nodes of the first resistor element Ra. The compressed net list is calculated as follows based on specific numerals. By using the Kirchhoff's law, the resistance becomes:

$$Ra = R15 + R16 + R17 + R18 + R19$$
$$= 5\,\Omega + 3\,\Omega + 12\,\Omega + 1\,\Omega + 6\,\Omega$$
$$= 27\,\Omega$$

Provided that the current sources connected to the intermediate nodes N7 to N10 are defined as current sources IA to ID, the current source IN2 of the compressed net list becomes:

$$IN2 = (R16 + R17 + R18 + R19)/Ra \times IA +$$
$$(R17 + R18 + R19)/Ra \times IB +$$
$$(R18 + R19)/Ra \times IC + R19/Ra \times ID$$

As IA=ID=0, $$IN2 = (R17 + R18 + R19)/Ra \times IB + (R18 + R19)/Ra \times IC$$

$$= (19 \times 3 + 7 \times 5)/27$$

$$= 3.4 \text{ A}$$

Likewise, the current source IN5 becomes $$IN5 = R15/Ra \times IA + (R15 + R16)/Ra \times IB +$$

$$(R15 + R16 + R17)/Ra \times IC +$$

$$(R15 + R16 + R17 + R18)/Ra \times ID$$

$$= (R15 + R16)/Ra \times IB + (R15 + R16 + R17)/Ra \times Ic$$

$$= (8 \times 3 + 20 \times 5)/27$$

$$= 4.6 \text{ A}$$

Therefore, Ra=27 Ω, IN2=3.4 A and IN5=4.6 A are acquired for the compressed net list in the first specific example in FIG. 7.

A second specific example in FIG. 8 is a method of circuit-compressing the compression target 20 to first and second resistor elements Rb and Rc, and a first current source IN connected to a connection node between both resistor elements. The compressed net list is calculated as follows based on specific numerals. By using the Kirchhoff's law, the current value becomes:

$$IN = IB + IC$$

$$= 3 + 5$$

$$= 8 \text{ A}$$

The resistances become:

$$Rb = Ra \times IN5/IN$$

$$= 27 \times 4.6/8$$

$$= 15.5 \, \Omega$$

$$Rc = Ra \times IN2/IN$$

$$= 27 \times 3.4/8$$

$$= 11.5 \, \Omega$$

Therefore, Rb=15.5 Ω, Rc=11.5 Ω and IN=8 A are acquired for the compressed net list in the second specific example in FIG. 8.

Figure 9:
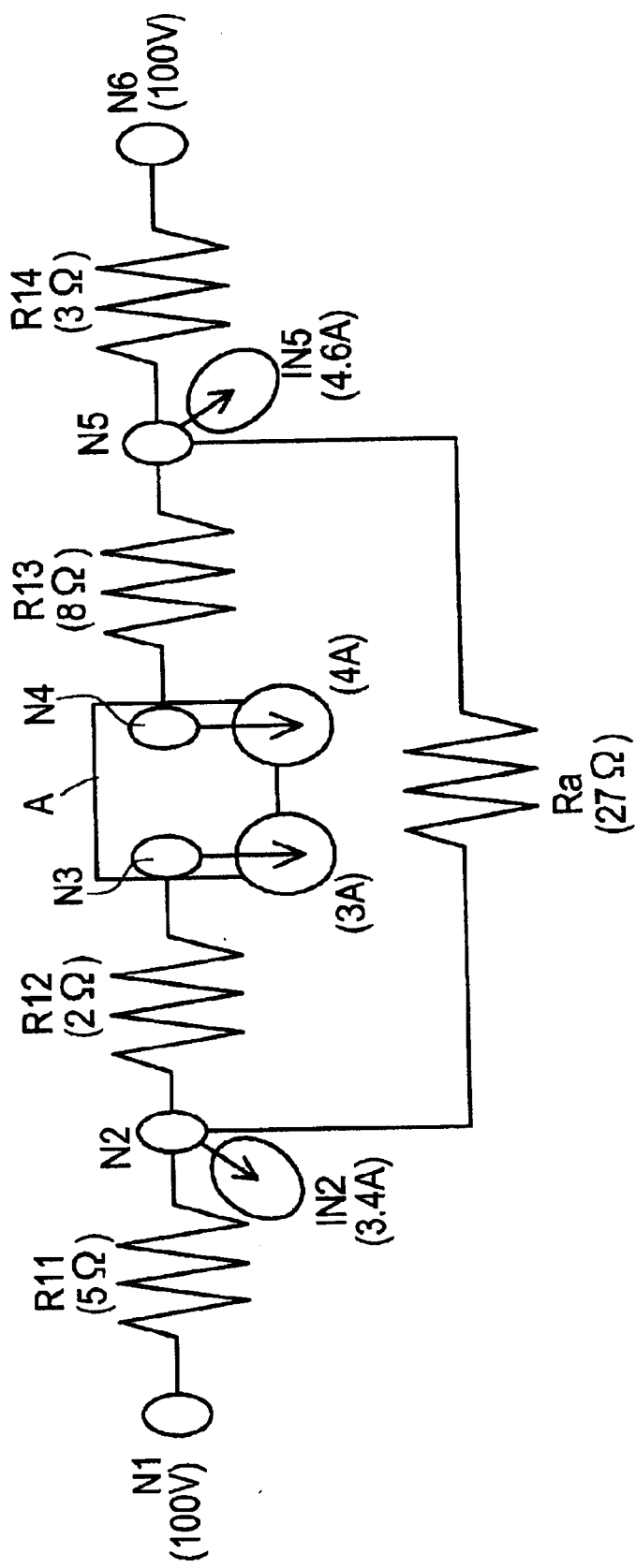
FIG. 9 is a circuit diagram illustrating an entire net list in case where a partial net list is replaced with the compressed net list of the first specific example.

FIG. 9 shows a net list as a result of adapting the compressed net list to the entire net list in S5. The diagram shows a case where the entire net list is replaced with the compressed net list of the first specific example shown in FIG. 7. This net list becomes simpler than the entire net list in FIG. 4 as the partial net list in FIG. 4 which is connected to the node N5 from the node N2 via the resistor elements R15 to R19 is replaced with the single resistor element Ra and two current sources IN2 and IN5.

Figure 10:
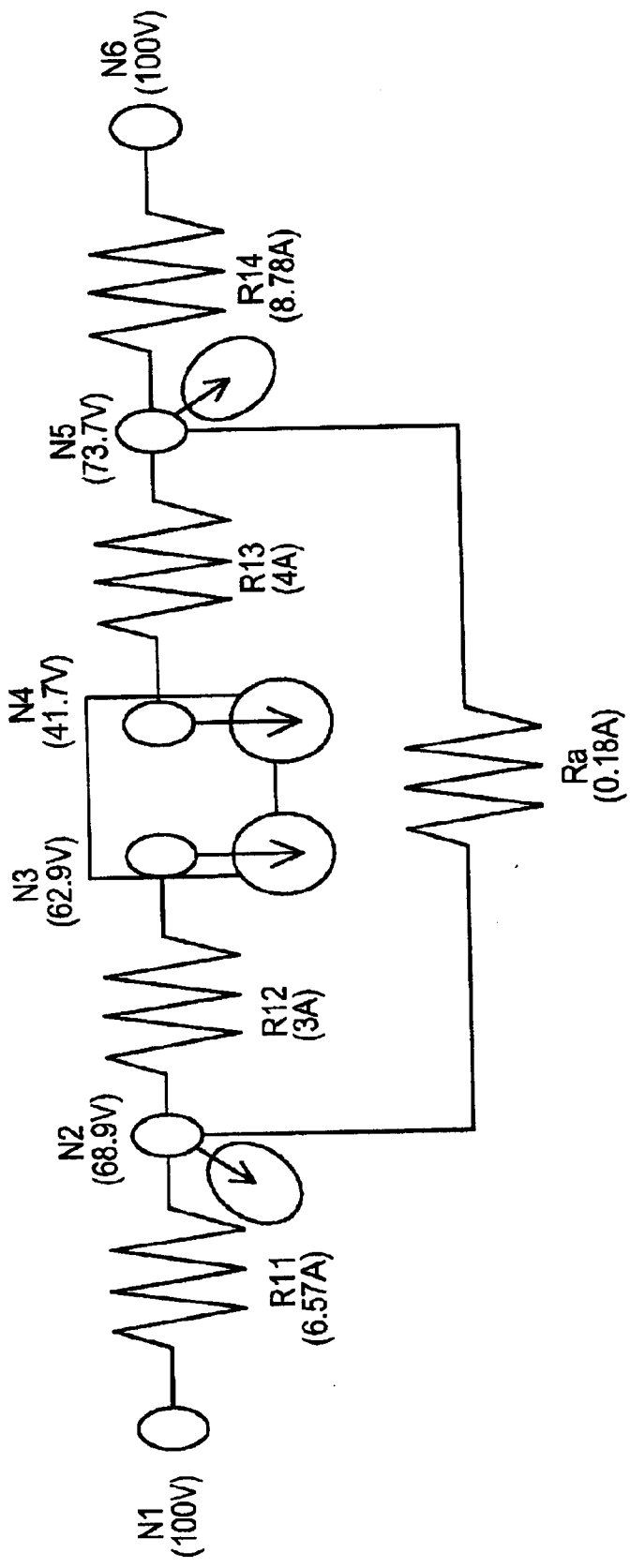
FIG. 10 is a circuit diagram showing the result of a power supply network analysis on the entire net list in FIG. 9.

FIG. 10 shows the result of a power supply network analysis in S6 performed on the entire net list in FIG. 9 by using specific values shown in FIG. 9. The analysis is carried out here on the premise that 100 V is applied to the external connection terminals N1 and N6. Given that the values of the currents that flow across the resistor elements R1 to R14 and Ra are defined as IR11 to IR14 and IRa with the direction from the node N1 to the node N6 being positive and the voltage values at the nodes N2 and N5 are defined as VN2 and VN5, the Kirchhoff's law provides the following:

IR11−3.4−IR12−IRa=0

IR13+IRa−4.6−IR14=0

IR12=3

IR13=−4

VN2=100−5×IR11

VN5=100+3×IR14

VN2−VN5=27×IRa

Solving those equations provides the analysis results shown in FIG. 10.

Figure 11:
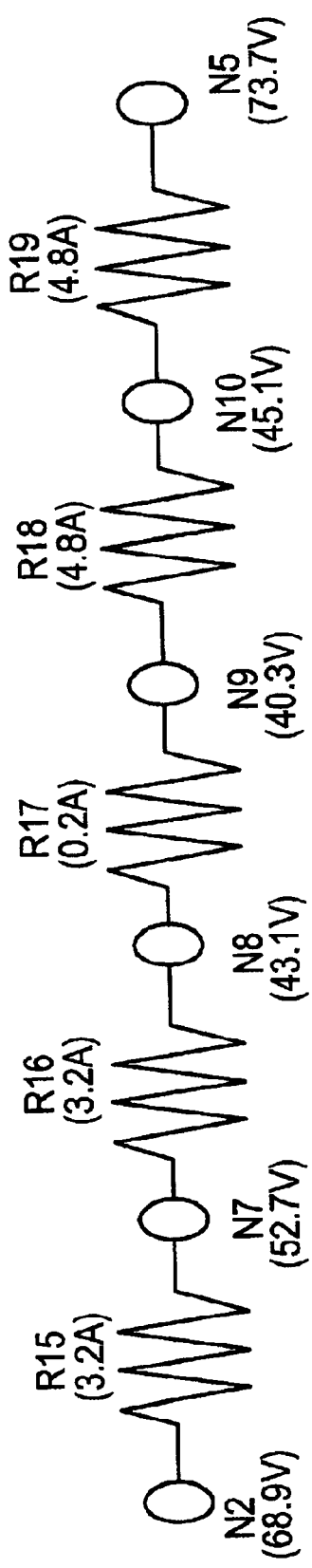
FIG. 11 is a circuit diagram showing the result of a power supply network analysis on the partial net list.

The voltage values at the nodes N2 and N5 as the connection nodes to the partial net list are also acquired by this analysis. S7 to S8 can allocate the voltage values to both end nodes N2 and N5 of the partial net list shown in FIG. 6. FIG. 11 shows the results of performing an analysis (S6) on the partial net list in FIG. 6 by applying 68.9 V to the node N2 and 73.7 V to the node N5. The individual node voltage values in the partial net list are obtained and the current values between the nodes can also be calculated from the voltage values. This provides the voltage values at all the nodes in the entire net list and current values between the nodes and completes the power supply network analysis.

According to the power supply network analyzing method of the embodiment, and a computer program, a storage medium and a power supply network analyzing apparatus, which execute the power supply network analyzing method, a partial net list is extracted (FIG. 6) in S3 from the compression target 20 (FIG. 5) selected in S2. Further, circuit compression is performed to extract a compressed net list (FIG. 7 or 8) in S4, and the compressed net list is replaced with a partial net list (FIG. 9) in the entire net list (FIG. 4) in S5. Accordingly, the power supply network analysis in S6 can be executed with the simplified entire net list. Based on the analysis results, a power supply network analysis of the partial net list before compression (FIG. 6) can be further carried out. As the power supply network is constructed hierarchically (FIG. 9) by replacing a part of the entire net list (FIG. 4) with the compressed net list (FIG. 7 or 8) undergone circuit compression, the power supply network analysis can be executed hierarchically. This can ensure a power supply network analysis of a large-scale circuit in a short period of time with fewer computer hardware resources.

As the Kirchhoff's law can be used in circuit compression of a partial net list (FIG. 6), net list information will not be omitted or lost in the compressed net list (FIG. 7 or 8). Therefore, the analysis precision will not become lower even in the power supply network analysis of the entire net list (FIG. 9) whose partial net list (FIG. 6) is replaced with the compressed net list (FIG. 7 or 8). Because the power supply network analysis of the partial net list (FIG. 6) is performed based on the analysis results, the precision of the analysis of the partial net list (FIG. 6) will not become lower. It is therefore possible to execute a power supply network analysis of a large-scale circuit in a short period of time with fewer computer hardware resources without lowering the analysis precision.

Because a limited portion which includes current sources and in which resistor elements are connected in series is selected as the compression target 20 or a partial net list to be compressed, circuit compression can be executed easily and the compressing process does not take time. Further, the partial net list (FIG. 6) to be selected has the number of power supply terminals to be limited to two (nodes N2 and N5), so that the compressed net list can be made sufficiently simple (FIG. 7 or 8). As an entire net list replaced with a compressed net list can be simplified (FIG. 9), it is possible to execute a power supply network analysis of a large-scale circuit in a short period of time with fewer computer hardware resources.

Here, the computer program which executes the power supply network analysis can be provided in the form of a storage medium where the program is stored, as well as can be supplied via a transmission medium, such as the Internet.

Because the physical connection relation, such as the layout relation of the circuit blocks A, B and C as circuit elements and layout information including the layout or the like of the power supply line 10 is known, the compression target 20 can be selected (S2) without searching the compression target 20 from the entire net list (FIG. 4) which comprises current sources and resistor elements every time, and the selection can be done simply in a short period of time.

Further, the compression target 20 is extracted regardless of circuit blocks in the hierarchical layout design in which they are laid out in units of predetermined circuit functions and are hierarchically assembled one layout unit after another, so that the compression target 20 can be selected freely without being restricted to the layout layer (S2).

Furthermore, the selection of the compression target 20 (S2) and the extraction of the entire net list (FIG. 4) are executed separately and independently. If the physical connection relation, such as the layout relation of the circuit blocks A, B and C and layout information including the layout or the like of the power supply line 10 is known, therefore, the compression target 20 can be freely selected irrespective of before or after the step of extracting the entire net list (S1). For example, the selection may be made prior to the entire net list extraction step (S1), may be made in parallel to the entire net list extraction step (S1), or may be made after the entire net list extraction step (S1). The power supply network analysis can thus be carried out efficiently.

Because the current sources included in a partial net list (FIG. 6) are determined specifically as average consumed current values in circuit elements or are determined specifically as the ratios of the average consumed current values, the current values of the current sources in the compressed net list (FIG. 7 or 8) after compression can be computed easily in case where the partial net list (FIG. 6) is subjected to circuit compression (S4). This ensures an efficient power supply network analysis.

Because the entire net list which is replaced with a compressed net list (FIG. 7 or 8) can be simplified (FIG. 9) by making the compressed net list (FIG. 7 or 8) undergone circuit compression as a power supply network model with the minimum quantity of constituting elements, a power supply network analysis of a large-scale circuit can be executed in a short period of time with fewer computer hardware resources.

The design information storage means D1 that stores various kinds of design information and the physical information storage means D2 that stores various kinds of physical information can be provided as the magnetic disk unit 4 or the external storage medium 9, such as a CD-ROM or a magnetic medium. The results of a power supply network analysis with respect to the voltage values of the individual nodes and current values between the individual nodes which are calculated by the first and second calculation means can be checked by confirmation means, such as the CRT 5. The power supply network analysis at this time is carried out by simplifying the circuit scale of the entire net list (FIG. 9) by using the compressed net list (FIG. 7 or 8) obtained by subjecting the partial net list (FIG. 6), extracted from the portion selected based on physical information, to circuit compression. Then, an analysis of the partial net list (FIG. 6) is further executed based on the analysis results. A net list which is handled in a single analysis process can be simplified by executing an analysis in two stages for each layer. The flow of the series of procedures of the power supply network analysis can be stored as a computer program in the memory 3 or the magnetic disk unit 4 in the power supply network analyzing apparatus 1. Alternatively, in case where such a program is stored in the external storage medium 9, such as a CD-ROM or a magnetic medium, the program can be executed by storing the program into the memory 3 or the magnetic disk unit 4 via the external-storage-medium drive unit 7 or by directly transferring the program to the CPU 2. The program can also be stored in the memory 3 or the magnetic disk unit 4 or can be transferred directly to the CPU 2, both via a transmission medium, such as the Internet.

The present invention is not limited to the embodiment described above and may of course be improved or modified in various manners within the scope and spirit of the present invention.

For example, although the foregoing description of the embodiment has been given of the case where there is one compression target, the present invention is not limited thereto and two or more compression targets can be selected as needed.

Although the foregoing description of the embodiment has been given of the case where there is one power supply line to be analyzed, the present invention is not limited to this particular case and an analysis can of course be carried out sequentially for two or more kinds of lines through similar processes.

Although the foregoing description of the embodiment has been given of the case where there are three constituting circuit blocks, the invention is not limited to this particular case and the invention can also be adapted to a case where there are more than three circuit blocks.

Although the foregoing description of the embodiment has been given of the case where a compression target is constructed by a circuit block unit, the invention is not limited to this particular case and a compression target can be selected arbitrarily without being restricted to the area of the circuit block. For example, the compression target may be a part of the circuit block or extends over a plurality of circuit blocks.

According to the present invention, at the time of analyzing a power supply network of a large-scale circuit device, a hierarchical analysis is executed in which a part of a net list is compressed to yield a simple net list which replaces the entire net list and an analysis is performed with the reduced-scale entire net list and then a partial net list before compression is analyzed based on the results of the previous analysis. This can allow a power supply network analysis of a large-scale circuit to be executed in a short period of time with fewer computer hardware resources.

What is claimed is:

1. A power supply network analyzing method for analyzing a characteristic of a power supply network having circuit elements to be supplied with power over power supply lines as current sources and constructed by dividing the power supply lines into resistor elements by using a net list of the power supply network, comprising:

a first step of converting the circuit elements to the current sources based on design information and computing the resistor elements included in the power supply lines based on physical information, thereby extracting an entire net list;

a second step of selecting a portion of the power supply network which includes the current sources and in which the resistor elements are connected in series, and extracting a partial net list;

a third step of acquiring a compressed net list by performing circuit compression on the partial net list;

a fourth step of replacing the partial net list with the compressed net list and acquiring voltage values of individual nodes in the entire net list and current values between the individual nodes in the entire net list by applying a supply voltage to a power supply terminal in the entire net list; and a fifth step of acquiring voltage values of individual nodes in the partial net list and current values between the individual nodes in the partial net list by giving both end nodes of the partial net list to voltage values of the individual nodes in the entire net list acquired by the fourth step.

2. The power supply network analyzing method according to claim 1, wherein the portion from which the partial net list is to be extracted is selected from the physical information associated with the power supply lines.

3. The power supply network analyzing method according to claim 2, wherein the physical information includes physical connecting relations between the circuit elements and the power supply lines.

4. The power supply network analyzing method according to claim 2, wherein selection of the portion from which the partial net list is to be extracted is carried out separately and independently of the second step.

5. The power supply network analyzing method according to claim 1, wherein the design information includes circuit information including parameters of the circuit elements and a connecting relation between the circuit elements.

6. The power supply network analyzing method according to claim 1, wherein the physical information is layout information including layout information of the circuit elements and layout information of the power supply lines and process device information including line type information of the power supply lines.

7. The power supply network analyzing method according to claim 1, wherein the current sources included in the partial net list are specifically determined as average consumed current values in the circuit elements expressed as the current sources.

8. The power supply network analyzing method according to claim 1, wherein in case where there are a number of the current sources included in the partial net list is two or more, the current sources are specifically determined as ratios among average consumed current values in the circuit elements expressed as the current sources.

9. The power supply network analyzing method according to claim 1, wherein the compressed net list includes:

a first resistor element; and first and second current sources connected to both end nodes of the first resistor element, which are the both end nodes of the compressed net list.

10. The power supply network analyzing method according to claim 1, wherein the compressed net list includes:

first and second resistor elements connected in series to each other; and a first current source connected to a connection node between the first and second resistor elements, and an other end node of the first resistor element and an other end node of the second resistor element are the both end nodes of the compressed net list.

11. A computer program which executes power supply network analysis for analyzing a characteristic of a power supply network having circuit elements to be supplied with power over power supply lines as current sources and constructed by dividing the power supply lines into resistor elements by using a net list of the power supply network, comprising:

a first step of replacing the circuit elements with the current sources having consumed source current values to be consumed in the circuit elements and replacing resistor components of the power supply lines with resistor elements which connect between predetermined nodes, based on input design information and physical information, thereby extracting an entire net list;

a second step of selecting a portion of the power supply network which includes the current sources and in which the resistor elements are connected in series, and extracting a partial net list from the entire net list extracted in the first step;

a third step of extracting a compressed net list which is the partial net list simplified;

a fourth step of replacing the partial net list with the compressed net list and acquiring voltage values of the predetermined nodes and values of currents flowing in the resistor elements by analyzing the entire net list; and a fifth step of acquiring the voltage values of the predetermined nodes in the partial net list and the values of currents flowing in the resistor elements in the partial net list by giving both end nodes of the partial net list to voltage values of the predetermined nodes acquired by the fourth step.

12. A storage medium in which a computer readable program is stored to execute power supply network analysis for analyzing a characteristic of a power supply network having circuit elements to be supplied with power over power supply lines as current sources and constructed by dividing the power supply lines into resistor elements by using a net list of the power supply network, the program comprising:

a first step of converting the circuit elements to the current sources based on design information and computing the resistor elements included in the power supply lines based on physical information, thereby extracting an entire net list;

a second step of extracting a partial net list of a portion of the power supply network which includes the current sources and in which the resistor elements are connected in series;

a third step of acquiring a compressed net list by performing circuit compression on the partial net list;

a fourth step of replacing the partial net list with the compressed net list and acquiring voltage values of individual nodes in the entire net list and current values between the individual nodes in the entire net list by applying a supply voltage to a power supply terminal in the entire net list; and a fifth step of acquiring the voltage values of the individual nodes in the partial net list and the current values between the individual nodes in the partial net list by giving both end nodes of the partial net list to voltage values of the individual nodes in the entire net list acquired by the fourth step.

13. A power supply network analyzing apparatus analyzing a characteristic of a power supply network having circuit elements to be supplied with power over power supply lines as current sources and constructed by dividing the power supply lines into resistor elements by using a net list of the power supply network, comprising:

design information storage means for storing circuit information including parameters of the circuit elements and connecting relations between the circuit elements as design information;

physical information storage means for storing, as physical information, layout information including layout information of the circuit elements and layout information of the power supply lines and process device information including line type information of the power supply lines;

selection means for selecting a portion of the power supply network which includes the current sources and in which the resistor elements are connected in series, based on the physical information;

entire-net-list extracting means for extracting an entire net list by converting the circuit elements to the current sources and acquiring connecting relations between the circuit elements based on the design information stored in the design information storage means, and by computing the resistor elements included in the power supply lines and acquiring layout information of the circuit elements based on the physical information stored in the physical information storage means;

partial-net-list extracting means for extracting the portion selected by the selection means as a partial net list based on the design information and the physical information;

net compressing means for acquiring a compressed net list by performing circuit compression on the partial net list;

first calculation means for replacing the partial net list with the compressed net list and acquiring voltage values of individual nodes in the entire net list and current values between the individual nodes in the entire net list by applying a supply voltage to a power supply terminal in the entire net list;

second calculation means for acquiring voltage values of individual nodes in the partial net list and current values between the individual nodes in the partial net list by giving both end nodes of the partial net list to voltage values of the individual nodes in the entire net list; and confirmation means for confirming results of operations performed in the first and second calculation means.

14. The power supply network analyzing apparatus according to claim 13, wherein the portion from which the partial net list is to be extracted is selected from the physical information associated with the power supply lines.

15. The power supply network analyzing apparatus according to claim 14, wherein the physical information includes physical connecting relations between the circuit elements and the power supply lines.

16. The power supply network analyzing apparatus according to claim 13, wherein the current sources included in the partial net list are specifically determined as average consumed current values in the circuit elements expressed as the current sources.

17. The power supply network analyzing apparatus according to claim 13, wherein in case where there are a number of the current sources included in the partial net list is two or more, the current sources are specifically determined as ratios among average consumed current values in the circuit elements expressed as the current sources.

18. The power supply network analyzing apparatus according to claim 13, wherein the compressed net list includes:

a first resistor element; and first and second current sources connected to both end nodes of the first resistor element, which are the both end nodes of the compressed net list.

19. The power supply network analyzing apparatus according to claim 13, wherein the compressed net list includes:

first and second resistor elements connected in series to each other; and a first current source connected to a connection node between the first and second resistor elements, and an other end node of the first resistor element and an other end node of the second resistor element are the both end nodes of the compressed net list.

* * * * *